United States Patent [19]

Mandt et al.

[11] Patent Number: 5,039,937

[45] Date of Patent: Aug. 13, 1991

[54] METHOD AND APPARATUS FOR PROVIDING COMPRESSED AND EXPANDED DISPLAYS ON A DIGITAL OSCILLOSCOPE

[75] Inventors: Gerald G. Mandt, Madison, Wis.; John H. McGibbon, Chandler, Ariz.

[73] Assignee: Nicolet Instrument Corporation, Madison, Wis.

[21] Appl. No.: 522,450

[22] Filed: May 11, 1990

[51] Int. Cl.$^5$ ............................................ G01R 13/20
[52] U.S. Cl. ................................ 324/121 R; 340/723; 364/487
[58] Field of Search ................... 324/121 R, 112, 111; 340/720, 723; 358/10, 139; 364/487, 521

[56] References Cited

U.S. PATENT DOCUMENTS

| | | | |
|---|---|---|---|
| 3,637,997 | 1/1972 | Petersen | 315/367 |
| 3,662,380 | 5/1972 | Cargile | 324/112 |
| 3,859,556 | 1/1975 | Schumann | 315/367 |
| 4,109,182 | 8/1978 | Dalton | 315/392 |
| 4,123,705 | 10/1978 | Olson | 324/121 R |
| 4,198,683 | 4/1980 | Dagostino | 364/900 |
| 4,225,940 | 9/1980 | Moriyasu et al. | 324/121 R |
| 4,302,755 | 11/1981 | Pisani et al. | 340/721 |
| 4,751,507 | 6/1988 | Hama et al. | 340/724 |
| 4,831,556 | 5/1989 | Oono | 340/731 |
| 4,837,561 | 6/1989 | Tucker | 324/121 R |
| 4,862,897 | 9/1989 | Eisenberg et al. | 128/715 |
| 4,975,636 | 12/1990 | Desautels | 364/487 |

OTHER PUBLICATIONS

J. W. Carlson, "Display Centering and Expansion System," *IBM Technical Disclosure Bulletin*, Apr. 1963, vol. 5, No. 11, pp. 89–91.

Tectronix 7D20 Operating Instructions, Chap. 2, pp. 52–55, 110–111.

*Primary Examiner*—Ernest F. Karlsen
*Attorney, Agent, or Firm*—Foley & Lardner

[57] ABSTRACT

A digital oscilloscope displays two waveforms on the CRT screen, a scroll bar waveform which is an abstracted representation of the full waveform data stored in memory and a generally expanded portion of the full waveform data in the memory. The portion of the full waveform that is displayed is selected by the operator by positioning cursor brackets along the abstracted scroll bar waveform to define a region of interest between the brackets. The region of interest so selected is displayed in expanded form showing all data points in the memory for the portion of the waveform being displayed. Creation of the abstracted scroll bar waveform is obtained by examining the waveform data in sections of equal time length and determining whether any data in each section falls within a series of predetermined ranges. The scroll bar waveform is formed of a series of columns of pixels equal in number to the number of sections of memory data, and having a number of pixels in each column equal to the number of data ranges. Pixels in each column are illuminated which correspond to data ranges for the corresponding section in which a datum was found.

20 Claims, 5 Drawing Sheets

METHOD AND APPARATUS FOR PROVIDING COMPRESSED AND EXPANDED DISPLAYS ON A DIGITAL OSCILLOSCOPE

FIELD OF THE INVENTION

This invention pertains generally to the field of digital oscilloscopes and particularly to the display of multiple versions of a waveform on a digital oscilloscope.

BACKGROUND OF THE INVENTION

Digital oscilloscopes operate by sampling a time varying analog signal periodically and storing the sample values in correlation with time in a waveform memory. These data may be then read out as locations in the memory are sequentially addressed by a clock signal to provide digital data which can be converted by a digital-to-analog converter to a time varying output signal which can be displayed on the face of a cathode ray tube (CRT). The waveform data may be further processed and placed in a display memory and the data in the display memory read out in the proper fashion to create the display on the CRT. The selection of the portion of the analog input waveform which is sampled and stored is determined by appropriate triggering circuitry so that the operator will have available the desired portion of the waveform which he wishes to review.

The waveform data stored in the waveform memory typically consists of a large number of data points (e.g., 50,000) which corresponds to the magnitude of the analog input signal which has been sampled at a sample rate over a selected period of time. If the full memory of data, constituting the full waveform which has been captured and stored, is read out, the entire waveform will be displayed extending over the width of the CRT screen.

When the entire captured waveform is displayed on the CRT face, the features of the waveform may be drawn so closely together that these features may be difficult to distinguish on visual examination. The density of the waveform as displayed may be such that the operator cannot conveniently use cursor or marker functions which are commonly found on digital oscilloscopes for measuring the magnitude of the waveform at particular points on the waveform. One way in which this problem can be simply resolved is to display only a portion of the full waveform on the CRT screen at any one time, thereby horizontally expanding the time base for the displayed waveform and more fully separating the data points that are displayed. This can easily be accomplished by, for example, reading out the data for the selected section of the waveform stored in memory at a slower rate compared with the movement of the electron beam horizontally across the CRT face to thereby spread further apart the points on the CRT screen which are illuminated. This technique corresponds roughly to speeding up the time base of the sweep in a conventional analog oscilloscope.

U.S. Pat. No. 3,859,556 to Schumann, the disclosure of which is incorporated herein by reference, discloses means for selecting any one of the displayed data points and providing an expanded display in which the selected point is at the center of the display and the number of adjacent data points which are displayed is determined by the selected point and the magnification factor. The selected point can also be varied during expansion.

One problem with displaying a portion of the stored waveform on an expanded time base is that the operator may not readily be able to determine the position within the full stored waveform at which the portion of the waveform being displayed is located. This problem has been addressed by displaying the full waveform data and simultaneously displaying the expanded portion of the waveform on the CRT screen. The position of the expanded waveform within the full waveform can be indicated by a cursor located on the full waveform. This cursor can be moved to change the location of the expanded portion of the waveform. In this approach, the expanded and unexpanded waveforms may be superimposed upon one another, which can interfere with visual examination of the waveforms. Horizontal expansion of the portion of the waveform may be limited to a fixed amount of expansion so that the operator may obtain an expanded waveform which is a greater or lesser portion of the waveform than he wanted. If the expanded part of the waveform is greater than the portion that he wanted, and if the waveform is sufficiently rapidly varying, fine detail features of the waveform may still be difficult to read on the expanded waveform. If the waveform memory is relatively large, it may contain much more data than the operator would ordinarily wish to look at as a full waveform. In such a case, the operator's main interest may be to look at portions of the waveform while nonetheless being able to review the full waveform simultaneously so that he can observe any long term trends in the waveform as well as significant transient changes in the input signal over the period of time during which the signal was sampled and stored.

SUMMARY OF THE INVENTION

Digital oscilloscope apparatus in accordance with the present invention simultaneously displays two waveforms, a scroll bar waveform which is an abstracted representation of the full waveform data stored in memory and a generally expanded portion of the full waveform data in the memory. The portion of the full waveform data that is displayed is selected by the operator by positioning cursor brackets along the abstracted waveform so that the brackets define between them the portion of the full waveform that the operator wants to show expanded. The portion of the waveform so selected is simultaneously displayed in expanded form with all data points in the memory for that portion of the waveform being displayed on the screen. The operator can move the brackets to change the width or the position of the expanded portion of the waveform that is shown on the screen. Although all data points in the memory are shown on the screen for the expanded portion of the waveform, the horizontal time scale is expanded appropriately so that the displayed portion of the waveform covers the full horizontal width of the screen.

The abstracted scroll bar waveform is produced by dividing the data in the waveform memory into a plurality of sections which generally will each correspond to a uniform period of time which collectively make up the full time period over which the waveform was collected. The generation of the abstracted scroll bar waveform is accomplished by examination of the data within each section. The entire range of magnitude of the input signal is divided into a plurality of magnitude subranges which together cover the entire minimum to maximum value of the data in the memory. The data within each section is examined and a register is set for each range in which a datum is found which is within the magnitudes for that range.

Each section within the memory corresponds to a single vertical column of the scroll bar waveform displayed on the CRT screen, with the number of columns in the scroll bar corresponding to the number of sections. Each column on the scroll bar waveform consists of a series of picture elements (pixels) equal in number to the number of data ranges. The abstracted waveform which forms the scroll bar is produced by illuminating with the CRT beam those pixels in each column which correspond to data ranges in a section in which a datum has been found, with the additional feature that if no datum is found in ranges between the highest and lowest ranges within which a datum is found, the intermediate pixels on the columns of the scroll bar display are nonetheless illuminated. Thus, a continuous line is formed between the highest and lowest illuminated pixels in each column. When all of the pixels found in the manner described above are illuminated in all of the columns the displayed scroll bar waveform forms an abstracted version of the full waveform in which the major features of the waveform contained in the memory are shown but with the elimination of fine details which would tend to obsure the major waveform features.

The apparatus of the invention preferably superimposes a pair of cursor brackets on the abstracted scroll bar waveform, with the position and size of the brackets being independently controllable by the operator by cursor and expansion controls. If the operator wishes to examine in detail a specific portion of the waveform which is revealed on the scroll bar display, he can move the brackets so that they lie on either side of the waveform region of interest. This region of the waveform will then be displayed by the apparatus on the CRT screen in a display which is preferably vertically and horizontally larger than the scroll bar display, and which will include just that region of the waveform which has been selected by the operator and which is enclosed within the brackets. Each datum in the display memory for the full waveform within the region of interest is displayed on the CRT screen. Preferably, the region of interest is determined by beginning with the first (time-wise) datum in the section of the memory in which the left bracket lies and the last (time-wise) datum in the section of the memory in which the right scroll bar lies. Each datum in memory corresponding to a single sample is preferably shown as a single point of light, with the horizontal separation between these points, as displayed, being inversely proportional to the number of data points which are placed on the screen.

During a waveform memory read, a point range decoder preferably monitors all data values that are being read by a central processing unit (CPU). Depending on the number of ranges utilized, a selected number of the most significant bits of the data value may be utilized to determine the range within which each datum lies. For example, if eight ranges are utilized, only the three most significant bits of the data value may need to be decoded to determine the proper range of that data value. When a data value is found within a particular range, an output register corresponding to that range is set if it has not already been set. The output from the registers can be represented as a binary word (e.g., eight bits where eight registers are used) with the least significant bit representing the presence of data in the lowest or most negative range and the most significant bit representing data in the largest or most positive range. The outputs of the registers are provided to a code look-up table memory which converts the information to an offset-point code count in a manner such that only the highest and lowest ranges have an effect on the offset-point code. The offset represents the number of pixels counting upwardly in each column, prior to the first pixel which will be illuminated, and the point count represents the number of pixels in the column which will be illuminated.

The abstracted scroll bar waveform need only occupy a relatively small portion of the CRT screen, since this version of the waveform only shows the major features of the waveform. Thus, the largest portion of the screen remains free and unobstructed for display of the expanded waveform which contains all of the fine details of the region of interest selected by the operator.

Further objects, features, and advantages of the invention will be apparent from the following detailed description when taken in conjunction with the accompanying drawings.

DETAILED DESCRIPTION OF THE INVENTION

The abstracted scroll bar waveform in accordance with the present invention is an additional display aid provided to the user of a digital oscilloscope to allow the user to zoom in on a detailed portion of a waveform without losing all time and voltage references. The user can view a small portion of a collected waveform both in a LIVE mode in which the waveform is being built up on the screen as it is being captured, and a HOLD mode in which the entire waveform has been captured and held until the user wishes to replace it. The LIVE mode is used to describe an operation similar to that of an analog scope in that the instrument is instructed automatically to take a sweep, display the waveform and repeat this process until instructed by the operator to return to the HOLD mode. In the HOLD mode, the instrument displays the last acquired waveform for examination. In both modes, the user is also allowed to see a representation of all the waveform data which resides in memory at that time.

Figure 1:
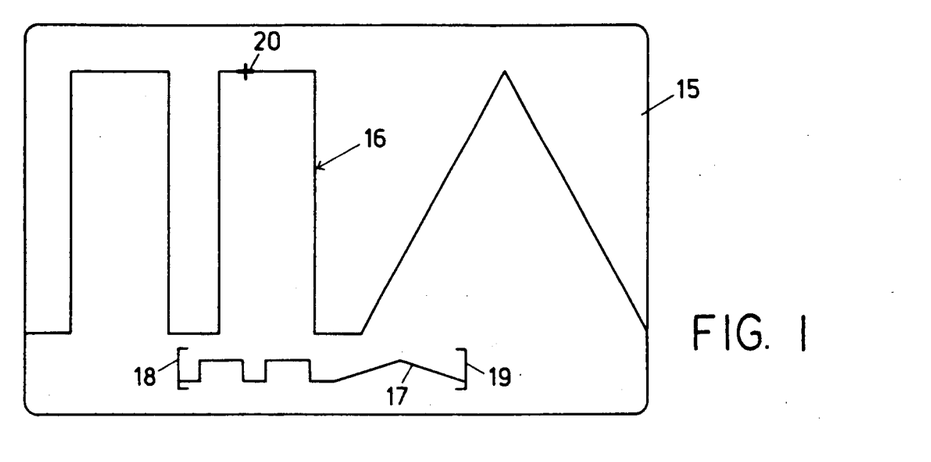
FIG. 1 is an illustrative view of a scroll bar waveform and a full data expanded waveform on a CRT screen in accordance with the present invention.

FIG. 1 is an illustrative view of a waveform (in this case, one which has been fully captured and is held in memory) on the screen 15 of a cathode ray tube (CRT). For illustrative purposes, the full captured waveform is shown at 16 and the abstracted scroll bar version of that waveform is shown at 17. A left cursor bracket 18 is drawn by the CRT beam at the very left edge of the scroll bar waveform 17 and a cursor bracket 19 is drawn on the CRT screen at the very right hand edge of the waveform 17. The location of the brackets 18 and 19 at the ends of the scroll bar waveform indicate to the user that the main displayed waveform 16 is the entire waveform that is stored in memory. A conventional point position cursor 20 may also be displayed on the expanded waveform.

Figure 2:
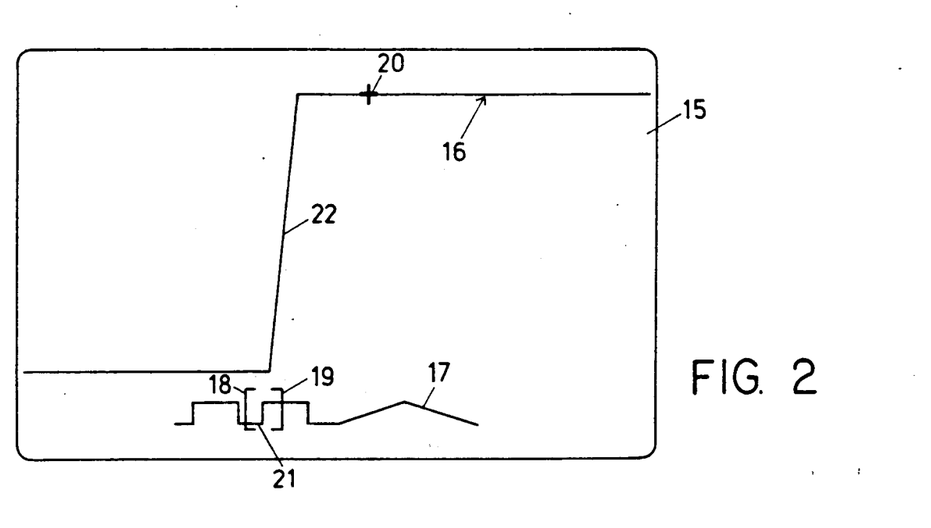
FIG. 2 is an illustrative view of a CRT screen as in FIG. 1, showing cursor brackets being utilized by the operator to select a small region of interest on the abstracted scroll bar waveform which is simultaneously displayed on the screen as an expanded waveform with all fine detail available from the waveform memory.

Another illustrative view of the CRT face 15 is shown in FIG. 2 wherein the same waveform has been collected by the digital oscilloscope. However, in the case of FIG. 2, the brackets 18 and 19 have been moved inwardly by the user to a position where they are on either side of a region of interest 21 of the overall waveform 17 that the user is particularly interested in. The conventional point cursor 20 may be located in a desired position within the region of interest, for example, at the center of the region. The main displayed waveform 17 has been expanded to show the details of the second rising edge 22 of the waveform. If the user wishes to examine other portions of the waveform, the user can manipulate appropriate input devices such as a mouse, a cursor control lever, touch keys or push buttons (not shown) on the oscilloscope apparatus to tell the apparatus to move the cursor 20 and brackets 18 and 19. For example, the brackets 18 and 19, when in a position in which they are closely adjacent to each other as shown in FIG. 2, can be moved together in either direction along the scroll bar waveform 17, which will result in the main waveform 16 moving across the screen in one direction or the other to display a section of the waveform with the same magnification as illustrated in FIG. 2. The position of the brackets on the scroll bar waveform 17 advises the user of the relative position of the region of interest of the expanded waveform 16 that he is viewing at any time.

In accordance with the present invention the scroll bar display may also be utilized in a XY display mode (i.e., the display of one time varying input signal versus another time varying input signal) rather than the YT mode (the display of a time varying input signal versus time). With one of the input signals initially displayed in the YT mode, the cursor brackets 18 and 19 can be positioned on the scroll bar waveform to select the portion of the overall waveform which is to be displayed as the main display waveform 16. When the XY mode is selected, only the portion of the waveform that is within the brackets is displayed as the Y waveform relative to the X waveform. In this way, many successive cycles of a waveform can be captured but only a selected number need be displayed on the screen individually. The scroll bar waveform 17 in this case would continues to be displayed on the screen to show the relative time position of the displayed portion of the Y waveform during the time-independent X-Y display.

The abstracted waveform which forms the scroll bar is composed of a series of vertical columns which are significantly fewer in number than the total number of data points collected and stored in the waveform memory. Each column as displayed is one picture element (pixel) wide, that is, each column is of a width equal to the width of a single dot that may be illuminated on the scroll bar waveform 17. The height of the column is the number of pixels in the column, which is significantly less than the available resolution of the data in the full waveform memory. The scroll bar waveform as thus constructed in accordance with the present invention is an abstracted version of the overall waveform stored in memory. For example, if the waveform memory is capable of storing 50,000 data points (50,000 equally spaced samples over the period of time during which sampling of the input waveform has occurred), the scroll bar waveform may be composed of, for example, 100 vertical columns so that each column may correspond to 500 data points collected over a period of time equal to 500 times the sampling period. The number of pixels available in each column will generally be far less than the vertical resolution of the waveform data in memory, which is determined by the resolution of the analog-to-digital converter which samples the analog input waveform and the available length of the data word in the waveform memory. For example, if the analog-to-digital converter provides an eight bit output word which is stored in the waveform memory, 256 different vertical levels are possible. However, the vertical resolution of the abstracted scroll bar waveform will be significantly less than this, for example, eight vertical levels of pixels.

Figure 3:
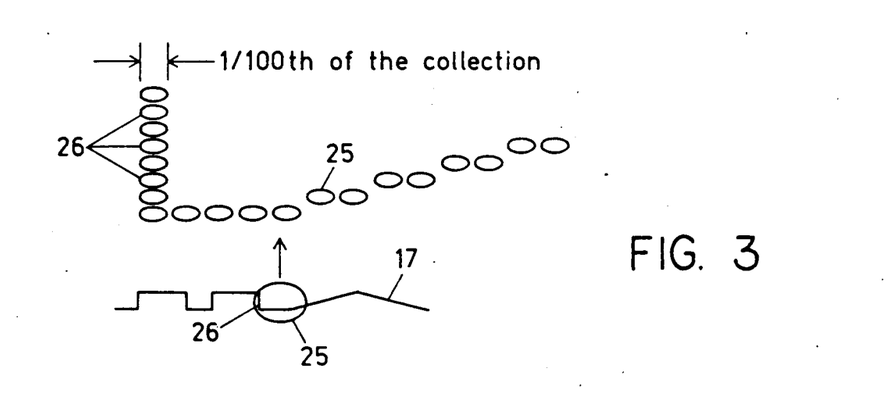
FIG. 3 is a illustrative view of a portion of the abstracted scroll bar waveform showing the manner in which the pixels are illuminated in each column comprising the scroll bar.

An exemplary representation of the manner in which the scroll bar waveform is generated on the screen is given in FIG. 3, in which a small portion 25 of the scroll bar waveform is enlarged to show the way in which the individual pixels are illuminated to form the waveform. Each column in the scroll bar waveform is one pixel wide. Each column could have only one illuminated pixel if the waveform is changing relatively slowly. However, if the waveform changes relatively rapidly, it is possible for a column to have more than one pixel illuminated, and, indeed, all pixels in the column can be illuminated—as illustrated by the pixels 26 which define the trailing edge of the second rectangular pulse in the waveform 17. This trailing edge may well have a non-infinite slope when shown in the expanded form of the waveform 16, but in the abstracted scroll bar waveform, the data is highly horizontally compressed. Any feature of the expanded waveform which has local maxima and minima within the 500 data points constituting a section of the waveform, corresponding to one column width on the screen, will not be seen in the abstracted scroll bar waveform. The scroll bar waveform will show the main waveform features and will illustrate any relatively long term trends in the waveform to the operator, while reducing the clutter of extraneous information which make it difficult for the operator to review the collected waveform when all data points constituting the waveform are simultaneously displayed on the CRT screen.

When a waveform is acquired and stored in the internal waveform memory of the oscilloscope, the magnitude data for the waveform is searched to determine the range between the highest and lowest (i.e., most positive and most negative) values for the data. This total data magnitude spread is divided into a plurality of ranges of equal height. Thus, the top pixel in each column is proportional to the most positive valued data which was collected and the bottom pixel in each column is proportional to the most negative valued data which was collected. Each column can be described by the number of pixels to be drawn in the column and the relative offset of these pixels from the bottom of the column, wherein the offset is the number of pixels in the column above the bottom which are not illuminated before the first pixel which is illuminated. For example, for a column having eight pixels, all possible combinations of pixels in the column can be described by a maximum value of eight for both the offset and count values, in which case the offset and count values can be represented by a four bit binary number, and both binary numbers can be combined together into one data byte which uniquely discribes the pixels to be drawn in a column. Using an eight bit byte with the offset put into the most significant nibble of the byte and the count placed in the least significant nibble of the byte (two of the digits in each byte need not be used), any allowable pixel display in the eight pixel column can be represented with thirty-six unique code values.

Figure 4:
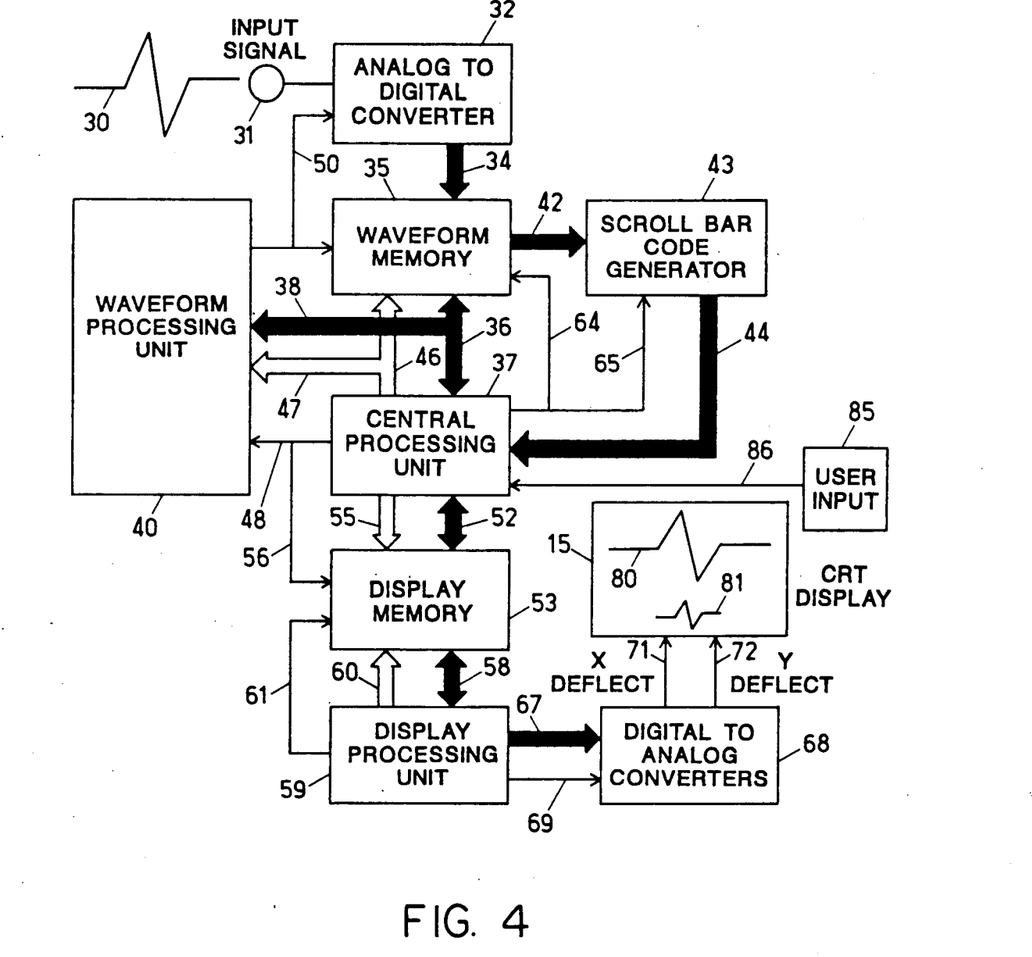
FIG. 4 is a schematic block diagram of the digital oscilloscope apparatus of the present invention.

A simplified illustrative block diagram of the digital oscilloscope apparatus which carries out the present invention is shown in FIG. 4. An analog input signal 30, which may be a time varying voltage, is received at an input terminal and input conditioning circuitry 31 and the conditioned analog signal is provided to an analog-to-digital converter 32. The converter 32 provides multi-bit digital data on a data bus 34 to a waveform memory 35 where the data is assigned and written sequentially to memory positions over the period of time during which the input signal is sampled and acquired. Circuitry for triggering on the input signal 30 to begin storage of waveform data in the waveform memory 35 may be of conventional design and is not shown in FIG. 4. The waveform memory 35 is in communication via data bus lines 36 to a central processing unit 37 and via data bus lines 38 to a waveform processing unit 40 of conventional design. The waveform acquisition unit 40 is of conventional technology capable of recording and recalling data collections. Its responsibilities include the writing of collected data points into the waveform memory 34 and remembering where the first point in the collection was written. This information is read by the central processing unit 37 and used to generate the display shown on the CRT screen 15. A data bus 42 provides data from the waveform memory 35 to a scroll bar code generator 43 described further below. The scroll bar generator is in communication with the central processing unit (CPU) controller 37 (e.g., a Motorola 68010 running with a 10 MHz clock) via data bus lines 44. The CPU 37 controls the writing of data into the waveform memory 35 and the reading of data from the memory via address bus lines 46 and the transfer of data to the waveform processing unit via an extension of the address bus lines 47. The control of the waveform processing unit 40 is also provided from the central processing unit by signals on control lines 48, with control lines 49 and 50 extending from the waveform processing unit to the waveform memory and the analog-to-digital converter 32.

Data from the CPU 37 is provided on data bus lines 52 to a display memory 53, with the writing of data into and reading of data out of the display memory being controlled from the central processing unit via address bus lines 55 and control lines 56. Output data read from the display memory 53 is provided on data bus lines 58 to a display processing unit 59 which controls the reading of this data via an address bus 60 and control lines 61. The CPU 37 also provides control signals to the waveform memory 35 via control lines 64 and to the scroll bar generator via control lines 65. The display may be generated in a conventional fashion, such as by vectored deflection, although a raster scanned display may also be used if desired.

The data from the display processing unit 59 is provided in digital form on a data bus 67 to a digital-to-analog converter 68 which is also controlled by the display processing unit 59 by signals passed over control lines 69. The digital-to-analog converter 68 provide an X deflection signal on a line 71 and a Y deflection signal on a line 72 to a cathode ray tube display unit 73 which includes conventional vertical and horizontal amplifiers and a cathode ray tube which generates a visual display on the CRT screen 15 of the waveform 80 (corresponding to data sampled from the analog input signal 30) and the scroll bar waveform 81. Commands from the user are provided through a user input and interface 85 which provides control signals on control lines 86 to the CPU 37.

All of the elements of the digital oscilloscope apparatus described above with respect to FIG. 4, except for the scroll bar code generator 43, are conventional and well known in the art. The construction and operation of the scroll bar code generator under control of the CPU is described futher below.

Figure 5:
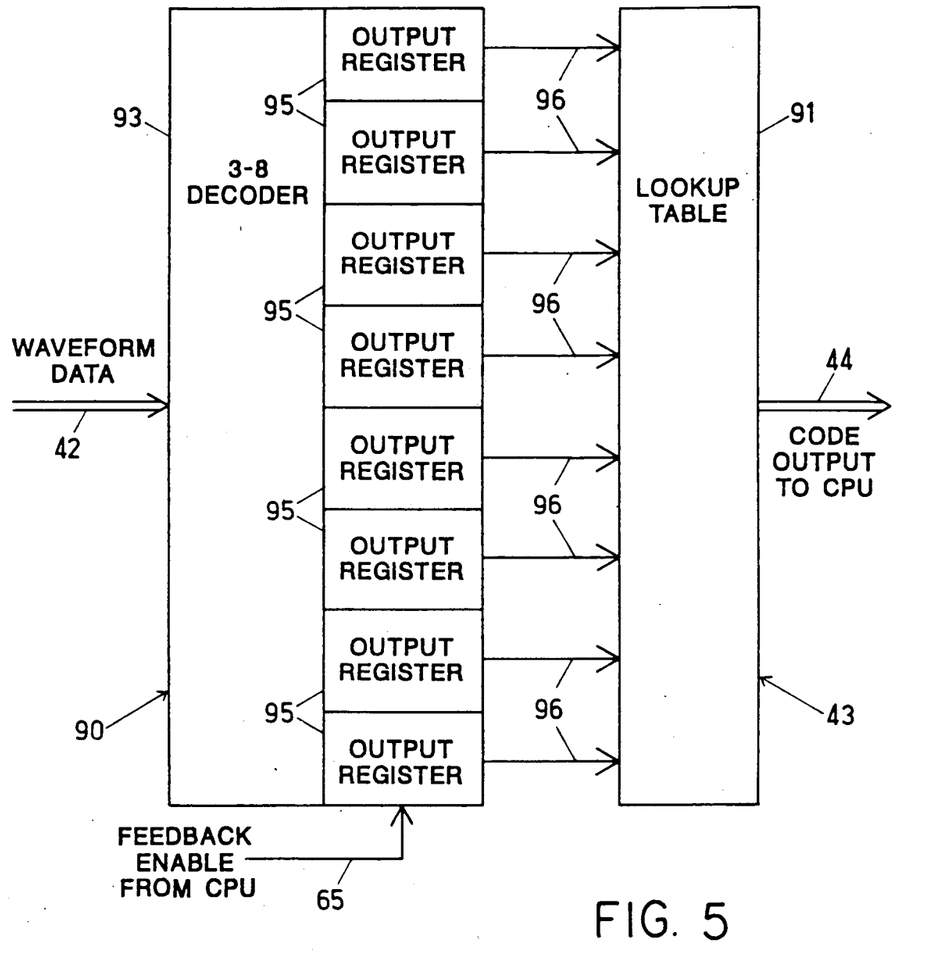
FIG. 5 is a schematic block diagram of a scroll bar code generator which may be utilized in the digital oscilloscope apparatus of the invention.

A detailed block diagram of a functional implementation of the scroll bar code generator 43 is shown in FIG. 5. The scroll bar code generator has two sections, a point range detector unit 90 and a read only (ROM) memory 91 which is programed with a lookup table. The point range detector 90 includes a decoder 93 which receives the data values on the data bus line 42 from the waveform memory during a waveform memory read under the control of the CPU 37. The decoder 93 determines in which of the several ranges which cover the total magnitude range of the input signal the waveform datum on the bus line 42 will fall. For example, if the total waveform magnitude is broken down into eight equal ranges, the decoder 93 can determine which of the eight ranges the data points should be assigned to by decoding only the three most significant bits of each binary datum. The decoder then has eight output lines 94 (not shown in FIG. 5) which extend to a series of eight output registers 95. Each output register 95 has an output line 96 which extends to the data inputs of the memory unit 91. The waveform decoder 93 reads the input datum on the bus line 42 and provides a SET signal to the appropriate one of the output registers 95 which will set that register if it has not previously been set. An enable signal on the feedback enable control line 65 from the CPU causes the output registers to remain set when and if an output register receives a SET input signal from the decoder. Removal of the enable signal on the control line 65 from the CPU resets or clears all of the output registers.

Figure 6:
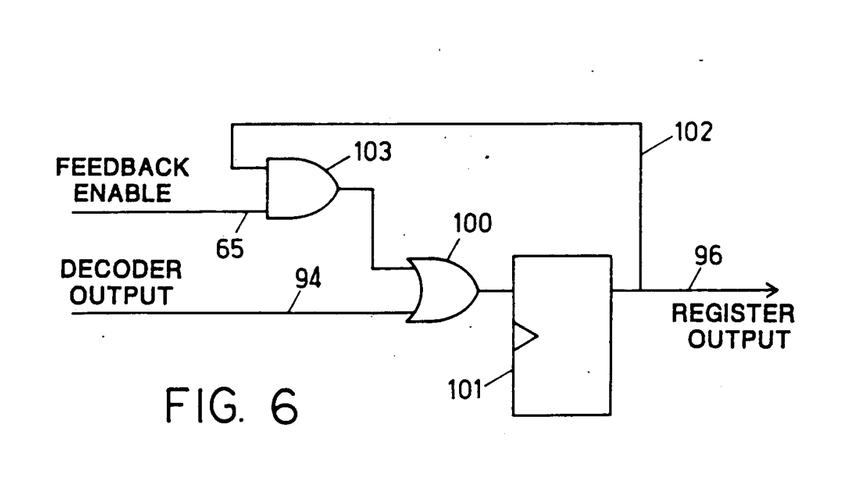
FIG. 6 is a schematic diagram of an output register which forms an element of the scroll bar code generator of FIG. 5.

The construction of each of the output registers 95 is shown in more detail in the block diagram of FIG. 6. Each register receives the output signal on a line 94 from the decoder to one input of an OR gate 100. The output of the OR gate 100 is provided to a flip-flop 101, the non-inverting output of which is connected to the output line 96. The output line from the flip-flop 101 is provided on a feedback line 102 to an AND gate 103 which also receives the feedback enable line 65 from the CPU. The output of the flip-flop 101 follows its input so that if the feedback enable signal on the line 65 is absent, the ouput on the line 96 from the output register will remain high only as long as the decoder output on the line 94 is high. If the line 94 goes low, the output signal on a line 96 will go low. However, if the feedback enable signal 95 is present, once the output of the decoder on a line 94 goes high, the output of the register 96 will go high and this output signal will be fedback via the line 102 through the AND gate 103 and the OR gate 100 to provide a high input signal to the flip-flop 101 as long as the feedback enable signal on the line 65 remains high. Thus, as long as the feedback enable signal from the CPU is present, once an output register is SET because a datum value is read which falls in the range assigned to that register, that register remains set.

The output of the point range detector 93 on the output lines 96 can be represented as (e.g., an eight bit) binary word with the least significant bit representing the presence of data in the smallest or most negative range (e.g., the smallest or most negative one-eighth of the overall range) and the most significant bit representing the presence of data which has been found to be within the most positive one-eighth of the data range. Thus, if data were read that only contained values within the most negative eighth of the data range, the output of the detector would be the binary value 00000001. A data value found at the top of the range would be represented by the binary value 10000000. Data that contained points in more than one of the eight ranges would have more than one bit set in the output word. For example, the data word 00001111 would be intepreted to mean that the waveform contained samples in the entire lower half of the input data range. A data word having the value 00001001 could be generated if the input data only contained values in the first and fourth of the eight ranges. Such a result could occur where a square-wave having a very sharp leading or trailing edge is digitized.

The outputs of the point range detector on the lines 96 are provided to the ROM memory 91 which contains a programed lookup table, i.e., the lines 96 are connected to the address bus lines of the memory 91 to address a proper memory location at which is stored a value which is intended to correspond to that address. That value is then read out on the output data lines 44 which extend to the CPU. The lookup table converts the output of the point range detector to the offset-point count code, and the table is preferably generated so that only the highest and lowest decoded ranges have an effect on the output from the lookup table. The codes that are provided are decoded as the upper 4 bits being the offset from the bottom or origin for a particular vertical segment and the lower 4 bits being the number of pixels to illuminate upwardly for that column. For example, the data values of 00001111 and 00001001 when provided to the lookup table will result in the same data value being provided from the memory 91 on the output bus 44. This output for the example just given would be a hexadecimal value of 04, indicating an offset from the bottom of zero pixels and that four pixels are to be drawn. The inputs to the lookup table could equivalently be written as 00001XX1, where X represents 'don't care', which could correspond to the four input values 00001111, 00001011, 00001101, and 00001001. The output from the lookup table on the data lines 44 is read directly by the CPU.

For an eight bit output from the range detector 93 to the lookup table memory 91 the lookup table is preferably programmed to provide output code as given in Table 1 below.

TABLE 1

| Binary Representation of Lookup Table Input | Hex Output of Lookup Table |
|---|---|
| 0000 0001 | 01 |
| 0000 0010 | 11 |
| 0000 0100 | 21 |
| 0000 1000 | 31 |
| 0001 0000 | 41 |
| 0010 0000 | 51 |
| 0100 0000 | 61 |
| 1000 0000 | 71 |
| 0000 0011 | 02 |
| 0000 0110 | 12 |
| 0000 1100 | 22 |
| 0001 1000 | 32 |
| 0011 0000 | 42 |
| 0110 0000 | 52 |
| 1100 0000 | 62 |
| 0000 01X1 | 03 |
| 0000 1X10 | 13 |
| 0001 X100 | 23 |
| 001X 1000 | 33 |
| 01X1 0000 | 43 |
| 1X10 0000 | 53 |
| 0000 1XX1 | 04 |
| 0001 XX10 | 14 |
| 001X X100 | 24 |
| 01XX 1000 | 34 |
| 1XX1 0000 | 44 |
| 0001 XXX1 | 05 |
| 001X XX10 | 15 |
| 01XX X100 | 25 |
| 1XXX 1000 | 35 |
| 001X XXX1 | 06 |
| 01XX XX10 | 16 |
| 1XXX X100 | 26 |
| 01XX XXX1 | 07 |
| 1XXX XX10 | 17 |
| 1XXX XXX1 | 08 |

Briefly summarized, the sequence for generating the scroll bar code for a given domain of data addresses includes first disabling the feedback enable signal and reading the first data value of the waveform address domain. This clears the point range detector 90 of any data held from a previous data read. The feedback enable signal is then enabled, allowing reading of all remaining waveform memory addresses within the address domain corresponding to a section of data. The maximum and minimum range of the input data will be represented at the outputs of the point range detector. The code lookup table is then read by the CPU. The entire scroll bar data is generated by calculating the address range for, (e.g., one percent of the data acquired and then generating the scroll bar code. This code is placed in a memory array and the process is repeated until each one percent section of the waveform is represented in the memory array. The CPU then generates the pixel representation of the scroll bar display and generates the brackets, positioned based on user input, and places these data representations in the display memory 53 at appropriate locations.

Figure 7:
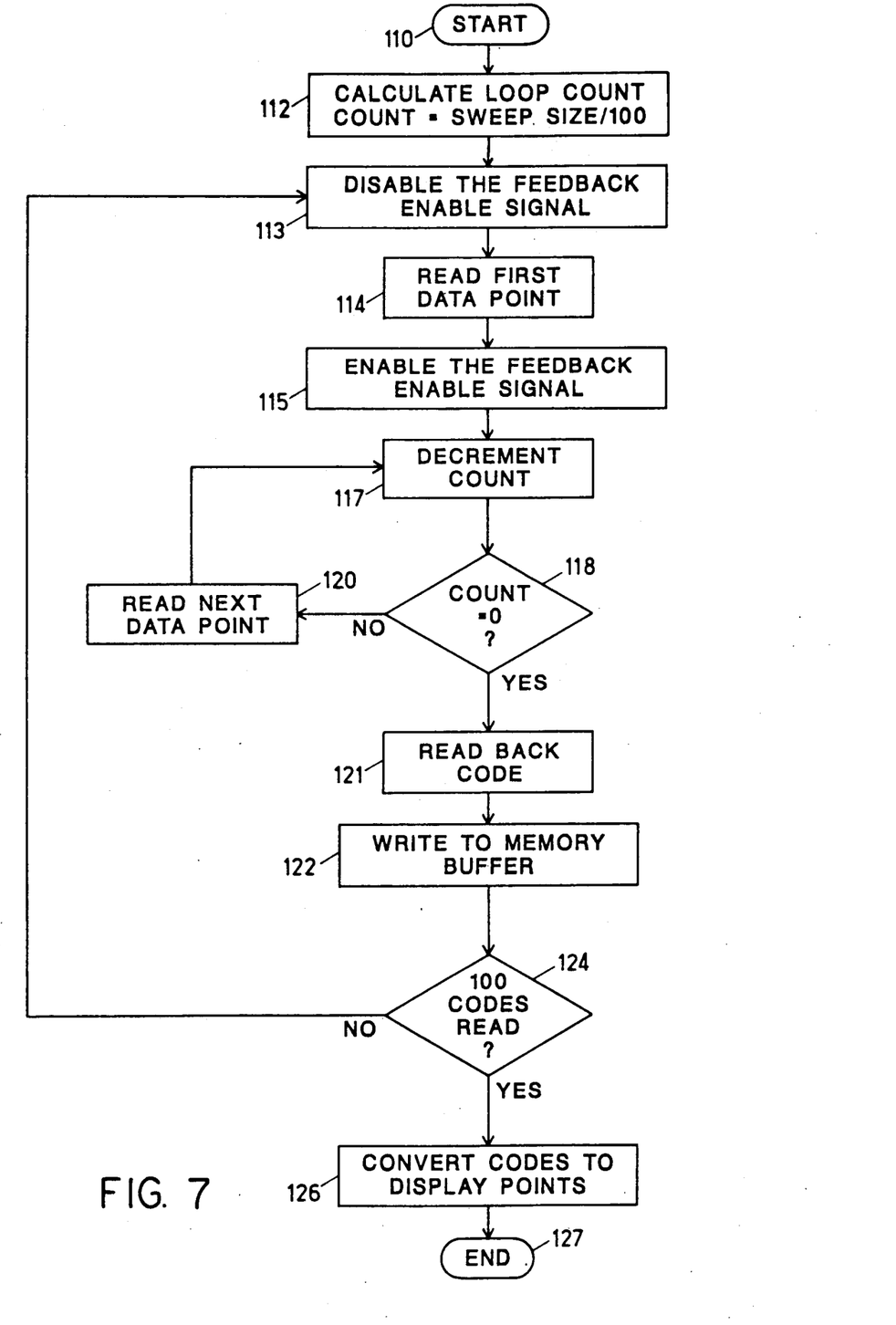
FIG. 7 is a flow chart illustrating the manner of operation of the scroll bar code generator under the control of the central processing unit for generating the abstracted scroll bar waveform code.

A flow chart showing the steps carried out by the CPU under software control in generating and retreiving the code is illustrated in FIG. 7. The program starts at 110 and calculates the loop count at 112 where the count is equal to the total sweep size divided by the number of sections—in the example shown, 100 sections. After the loop count is calculated, the feedback enable signal is disabled (block 113). The first data point is read at 114 and the feedback enable signal is enabled at 115. The loop count is decremented by one (block 117) and the count is then checked to see if it is equal to zero at block 118. If not, the next data point is read at block 120 and the count is decremented at block 117 and checked at block 118 again. This cycle continues until the count equals zero, at which point the CPU reads back the code (block 121), and writes the code to the memory buffer (block 122). The CPU then checks to determine whether 100 codes have been read at decision block 124. If not, the program then cycles back to block 113, disables the feedback enable signal, and retraces through the loop once again. When 100 codes have been read, the codes are converted to display pixels points (block 126) which are provided to the display memory and the program ends (127) until a new waveform is acquired.

Bracket algorithms are used for expanded displays as in FIG. 2. The cursor location 20 identified as the point of interest can range from 0 on the left edge to one less than the length of the acquisition on right edge. FIG. 1 is a view of the entire or unexpanded waveform. The operator may increase the horizontal expansion to zoom in on the point of interest 20 as in FIG. 2. By increasing the horizontal expansion, the number of points on the screen, or screen size, is reduced.

The very leftmost point on the abstracted waveform 17 will be referenced as the origin in the following equations. The left bracket position can be calculated as follows:

$$\text{left} = \frac{(\text{cursor} - (\text{screen size} \times 0.5)) \times 100}{\text{acquisition length}}$$

For example, FIG. 2 left bracket 18 position can be calculated given the following parameters:

| | |
|---|---|
| acquisition length | = 1000 |
| cursor | = 300 |
| screen size | = 100 |

The value for the left bracket 18 is calculated as follows:

$$\text{left} = \frac{(300 - (100 \times 0.5))}{1000} \times 100 = 25$$

The 25 would represent 25 pixels to the right of the origin. This would be where the left bracket 18 would be drawn for FIG. 2.

The right bracket 19 position can be calculated using the following equation:

$$\text{right} = \frac{(\text{cursor} + (\text{screen size} \times 0.5))}{\text{acquisition length}} \times 100$$

Using the same parameters as above, the value for the right bracket is calculated as follows:

$$\text{right} = \frac{(300 + (100 \times 0.5)) \times 100}{1000} = 35$$

The 35 would represent 35 pixels to the right of the origin. This would be where the right bracket 19 would be drawn for FIG. 2.

When the operator alters the vertical expansion, this is indicated by decreasing the number of pixels in the bracket by one, thus reducing the height of the bracket by one for both brackets 18 and 19. The bracket height when not expanded vertically should be one more than the number of vertical expansion factors so the top edges never overlap.

Figure 8:
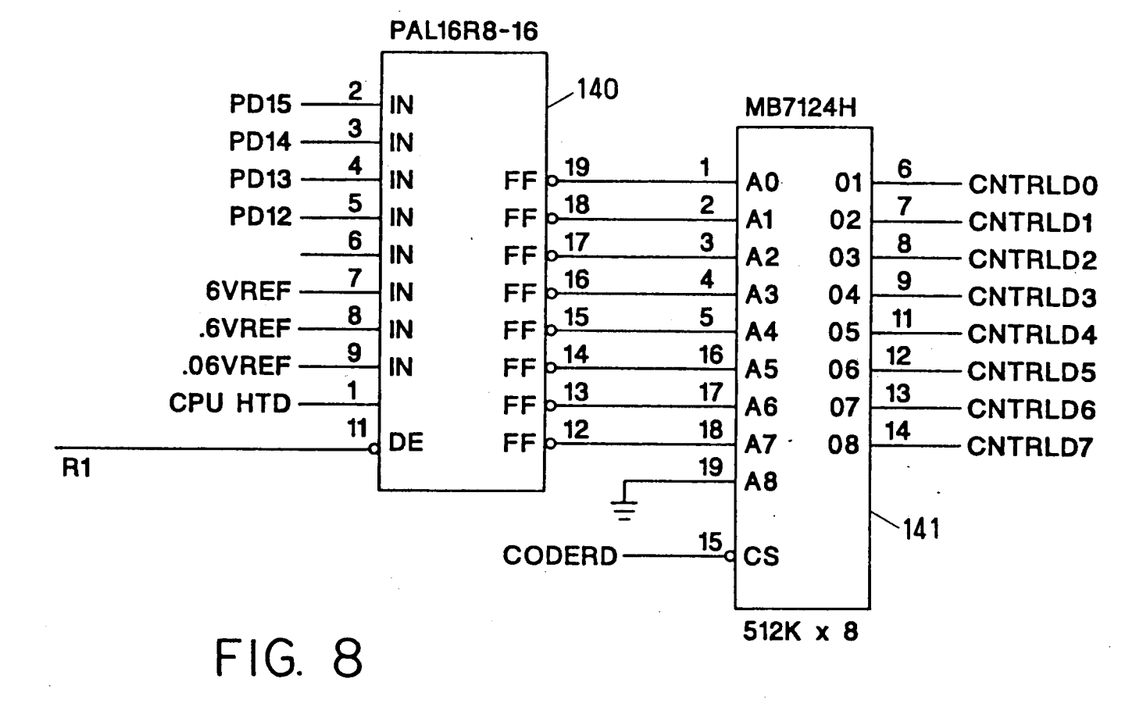
FIG. 8 is a schematic block diagram of a preferred implementation of the scroll bar code generator.

A preferred hardware implementation of the scroll bar code generator 43 is shown in FIG. 8. This implementation performs the functions of the circuit elements of FIGS. 5 and 6 using a programmable array logic (PAL) unit 140 (e.g., PAL 16R8-16) and a PROM 141 (e.g., 512K×8 bit MB 7124H) which receives the output of the PAL 140 at its address inputs A0-A7. The following are the PAL connections and equations that provide the desired functions:

```
PAL
16R8
;PINS    1        2        3         4         5
         CLK      PD15     PD14      PD13      PD12
;PINS    6        7        8         9         10
         NC       5VREF    p5VREF    p05VREF   GND
;PINS    11       12       13        14        15
         /OEENA   A7       A6        A5        A4
;PINS    16       17       18        19        20
         A3       A2       A1        A0        VCC
EQUATIONS:
A0 := (/PD13 * /PD14 *  PD15+A0 * 5VREF)
A1 := ( PD13 * /PD14 *  PD15+A1 * 5VREF)
A2 := (/PD13 *  PD14 *  PD15+A2 * 5VREF)
A3 := ( PD13 *  PD14 *  PD15+A3 * 5VREF)
A4 := (/PD13 * /PD14 * /PD15+A4 * 5VREF)
A5 := ( PD13 * /PD14 * /PD15+A5 * 5VREF)
A6 := (/PD13 *  PD14 * /PD15+A6 * 5VREF)
A7 := ( PD13 *  PD14 * /PD15+A7 * 5VREF)
```

If the calculation of the abstracted waveform were carried out entirely in software in the CPU 37, typical calculation times for a standard microprocessor (Motorola 68010 running at 10 MHz) over a data range of 250,000 points would be approximately 2 seconds. The same speed processor with the assistance of the scroll bar code generator 43 in the data path and using the algorithm as in the flowchart of FIG. 7, can generate the abstracted waveform in 60 ms. This is approximately the same time as it takes to read the memory. The difference in time required is because of the relatively large number of instruction cycles the CPU would have to execute to replace the read next data point step 120 in FIG. 7. The read would have to be replaced by a read, compare, read, compare, and store for a worst case situation. The additional compare and branch instructions executed can account for a magnitude of differences between the execution times.

It is understood that the invention is not confined to the particular embodiments disclosed herein as illustrative, but embraces all such modified forms thereof as come within the scope of the following claims.

What is claimed is:

1. Digital oscilloscope apparatus comprising:
   (a) a waveform memory;
   (b) means for sampling a time varying signal to produce digital data corresponding to the waveform of the signal and storing the data in the waveform memory;
   (c) display means for receiving digital data to provide a visual display of the waveform corresponding to the data on a display screen;

(d) means for determining for each of a plurality of sections of the data in the waveform memory, each section correponding to data taken during a selected period of time, whether the data in each section includes a datum falling within each of a selected number of magnitude ranges and for providing control data to the display means such that the display means displays columns of pixels for each section of waveform data with pixels being illuminated in each column which correspond to those ranges for which a datum fell within that range, to form an abstracted scroll bar waveform displayed on the display screen.

2. The apparatus of claim 1 further including a display memory for receiving and storing the abstracted scroll bar waveform data which is loaded into the display memory, and wherein the display memory is connected to the display means and the data therein is read out to the display means to provide the abstracted scroll bar waveform display on the display screen.

3. The apparatus of claim 2 wherein at least a portion of the data corresponding to the full data waveform in the waveform memory is also stored in the display memory and wherein the display means displays both the portion of the full data waveform and the abstracted scroll bar waveform on the display screen.

4. The apparatus of claim 3 wherein the display means also provides a pair of cursor brackets superimposed on the displayed scroll bar waveform which are moveable on the scroll bar waveform to define a region of interest between the cursor brackets, and wherein the display means displays that portion of the full waveform which corresponds to full waveform data between the positions on the scroll bar waveform at which the cursor brackets are located.

5. The apparatus of claim 1 wherein the means for determining includes a scroll bar code generator which comprises a decoder for determining the relative magnitude of data with respect to a plurality of equal magnitude data ranges and to provide a SET signal on an appropriate one of a plurality of output lines, each corresponding to one magnitude range, when a datum is decoded which is within the magnitude of that range, a plurality of registers which are connected to the output lines from the decoder and which are settable by a SET signal and which can be reset, and a preprogramed memory connected to receive the outputs of the registers as the inputs to its addressed lines, the memory being programmed to provide a digital output signal from the memory at the location address by the output of the registers which is coded to provide a number corresponding to the number of pixels to be illuminated in each column corresponding to one section of waveform data, and an offset corresponding to the number of pixels from the bottom of the column to the first pixel which is illuminated.

6. The apparatus of claim 5 wherein the preprogramed memory provides a coded output signal such that for each column, all pixels between the pixel corresponding to the highest magnitude range in which a datum was found and the pixel corresponding to the lowest magnitude range in which a datum was found are illuminated.

7. The apparatus of claim 1 wherein, in the means for determining, the magnitude range of the waveform data is divided into eight equal ranges of magnitude.

8. The apparatus of claim 2 wherein the display means includes a cathode ray tube with a screen on which the abstracted scroll bar waveform is drawn and digital-to-analog converters for providing the X and Y deflection signals to the cathode ray tube and one of which receives the scroll bar waveform data repetitively to draw the scroll bar waveform on the screen.

9. The apparatus of claim 1 wherein the means for determining includes a programmable array logic which is programed to determine the relative magnitude of data with respect to a plurality of equal magnitude data ranges and to provide a signal on an appropriate one of a plurality of output lines, each corresponding to one magnitude range, when a datum is decoded which is within the magnitude of that range, and a preprogramed memory connected to receive the outputs of the programmable array logic as the inputs to its addressed lines, the memory being programed to provide a digital output signal from the memory at the location addressed by the output of the registers which is coded to provide a number corresponding to the number of pixels to be illuminated in each column corresponding to one section of waveform data, and an offset corresponding to the number of pixels from the bottom of the column to the first pixel which is illuminated.

10. The apparatus of claim 9 wherein the preprogramed memory provides a coded output signal such that for each column, all pixels between the pixel corresponding to the highest magnitude range in which a datum was found and the pixel corresponding to the lowest magnitude range in which a datum was found are illuminated.

11. Digital oscilloscope apparatus comprising:
(a) an analog-to-digital converter which receives an analog input signal and provides digital output data corresponding to the magnitude thereof;
(b) a waveform memory which receives and stores the digital data from the analog-to-digital converter;
(c) scroll bar code generator means for receiving the waveform memory data in sections corresponding to equal periods of time of acquisition of the data in the memory and providing an output code for each section which indicates whether data was found in that section in each of a plurality of data magnitude ranges;
(d) a display memory;
(e) digital-to-analog converter means for converting digital data provided from the display memory to an analog signal;
(f) a cathode ray tube display connected to the digital-to-analog converter means to provide a visual display on a CRT screen corresponding to the signal from the digital-to-analog converter means;
(g) CPU control means for controlling the waveform memory, the scroll bar code generator means, and the display memory, for storing data in the display memory which corresponds to an abstracted scroll bar waveform determined in accordance with the code provided by the scroll bar code generator means, for storing in the display memory at least a portion of the full waveform data from the waveform memory, and for reading out the data in the display memory to the digital-to-analog converter means such that the abstracted scroll bar waveform and the portion of the full data waveform are displayed simultaneously on the CRT screen.

12. The apparatus of claim 11 wherein the scroll bar code generator means comprises a decoder for determining the relative magnitude of the data within each section with respect to the plurality of data magnitude ranges and providing a SET signal on an appropriate one of a plurality of output lines, each corresponding to one magnitude range, when a datum is decoded which is within the magnitude of that range, a plurality of registers which are connected to the output lines from the decoder and which are settable by a SET signal from the decoder and which are clearable by a signal from the CPU, and a preprogrammed memory with the registers connected to the address bus of the preprogramed memory such that the data stored at the memory locations provides a coded output from the memory for each section indicating the number of pixels in a column corresponding to that section which are to be illuminated and the number of pixels from the bottom of the column to the first pixel which is illuminated, and wherein the CPU provides and an enable signal to the registers to clear the registers and reset them to receive new data at the end of the examination of all the data in a section.

13. The apparatus of claim 11 wherein in the display control means controls the storing of data in the display memory to provide a pair of cursor brackets superimposed on the display scroll bar waveform which are moveable on the scroll bar waveform to define a region of interest between the cursor brackets, and wherein the CPU controls the loading of data to the display memory and the reading out of that data to provide a display of that portion of the full waveform which corresponds to full waveform data between the positions on the scroll bar waveform in which the cursor brackets are located.

14. The apparatus of claim 12 wherein the preprogrammed memory provides a coded output signal such that, for each column, all pixels between the pixel corresponding to the highest magnitude range in which a datum was found and the pixel corresponding to the lowest magnitude range in which the datum was found are illuminated.

15. The apparatus of claim 11 wherein the magnitude range of the waveform data is divided into eight equal ranges of magnitude which are examined by the decoder.

16. The apparatus of claim 11 wherein the scroll bar code generator means comprises a programmable array logic which is programed to determine the relative magnitude of the data within each section with respect to the plurality of data magnitude ranges and providing a signal on an appropriate one of a plurality of output lines, each corresponding to one magnitude range, when a datum is decoded which is within the magnitude of that range, and a preprogrammed memory, the output lines of the programmable array logic connected to the address bus of the preprogramed memory such that the data stored at the memory locations provides a coded output from the memory for each section indicating the number of pixels in a column corresponding to that section which are to be illuminated and the number of pixels from the bottom of the column to the first pixel which is illuminated.

17. A method of compressing data corresponding to an acquired waveform stored in the waveform memory of a digital oscilloscope comprising the steps of:
  (a) dividing the data in the waveform memory into a plurality of sections constituting equal lengths of time over which the data was acquired;
  (b) examining the data in each section and determining whether or not there is a datum which falls in each of a selected number of magnitude ranges which cover the entire range of magnitude of the data in the waveform memory;
  (c) displaying an abstracted scroll bar waveform on a display screen which comprises a plurality of columns equal to the number of sections in the waveform memory, each column having a number of pixels equal to the ranges which cover the range of waveform data, and illuminating those pixels in each column corresponding to a section in waveform memory if a datum was found in the corresponding section which lies in the range corresponding to the pixel in the column of the display.

18. The method of claim 17 wherein in the step of illuminating the pixels, for each column, all pixels between the pixel corresponding to the highest magnitude range in which a datum was found and the pixel corresponding to the lowest magnitude range in which a datum was found are illuminated.

19. The method of claim 17 including the additional step of displaying on the display screen simultaneously with the scroll bar waveform a full data waveform corresponding to at least a portion of the data in the waveform memory.

20. The method of claim 19 including the step of displaying a pair of cursor brackets superimposed on the scroll bar waveform and wherein the full data waveform displayed corresponds to the data in the waveform memory between the positions in the waveform at which the cursor brackets are located.

* * * * *